United States Patent
Wang et al.

(10) Patent No.: US 7,767,982 B2
(45) Date of Patent: Aug. 3, 2010

(54) OPTICAL AUTO FOCUSING SYSTEM AND METHOD FOR ELECTRON BEAM INSPECTION TOOL

(75) Inventors: Yi Xiang Wang, Fremont, CA (US); Van-Duc Nguyen, Los Altos, CA (US); Jian Zhang, Beijing (CN)

(73) Assignee: Hermes-Microvision, Inc., Hsinchu (TW)

( * ) Notice: Subject to any disclaimer, the term of this patent is extended or adjusted under 35 U.S.C. 154(b) by 323 days.

(21) Appl. No.: 11/759,138

(22) Filed: Jun. 6, 2007

(65) Prior Publication Data

US 2008/0302974 A1 Dec. 11, 2008

(51) Int. Cl.
*H01J 49/00* (2006.01)
*B01D 59/44* (2006.01)

(52) U.S. Cl. .............. 250/491.1; 250/310; 250/311; 250/492.1; 250/492.22; 250/492.23; 250/559.3; 250/559.4; 355/63; 355/65; 355/66; 355/67

(58) Field of Classification Search .......... None
See application file for complete search history.

(56) References Cited

U.S. PATENT DOCUMENTS

| | | |
|---|---|---|
| 4,391,524 A | 7/1983 | Steigmeier |
| 4,889,998 A | 12/1989 | Hayano et al. |
| 5,096,291 A | 3/1992 | Scott |
| 5,317,380 A | 5/1994 | Allemand |
| 5,585,629 A | 12/1996 | Doran et al. |
| 6,107,637 A | 8/2000 | Watanabe et al. |
| 6,172,365 B1 | 1/2001 | Hiroi et al. |
| 6,597,006 B1 | 7/2003 | McCord et al. |
| 6,919,577 B2 * | 7/2005 | Watanabe et al. ........ 250/559.4 |
| 7,053,355 B2 * | 5/2006 | Ye et al. .................. 250/208.1 |
| 7,138,629 B2 * | 11/2006 | Noji et al. .................... 250/311 |
| 7,323,697 B2 * | 1/2008 | Kaga et al. ............... 250/491.1 |
| 7,329,889 B2 * | 2/2008 | Watanabe et al. ........ 250/559.3 |
| 7,573,049 B2 * | 8/2009 | Kaga et al. ............... 250/491.1 |
| 2006/0169900 A1 * | 8/2006 | Noji et al. .................... 250/310 |
| 2006/0284088 A1 * | 12/2006 | Fukunaga et al. ........... 250/310 |
| 2007/0252966 A1 * | 11/2007 | Shirata ........................ 355/67 |
| 2008/0174779 A1 * | 7/2008 | Kaga et al. ................... 356/401 |
| 2009/0261251 A1 * | 10/2009 | Hayakawa et al. .......... 250/310 |

* cited by examiner

*Primary Examiner*—David A Vanore
(74) *Attorney, Agent, or Firm*—Townsend and Townsend and Crew LLP (57) ABSTRACT

A method and system for inspecting a semiconductor wafer. The method includes providing an illumination flux through a pattern plate and a lens to a surface of a specimen to project a pattern onto the surface of the specimen. The pattern is associated with the pattern plate. Additionally, the method includes detecting the illumination flux reflected from the surface of the specimen with a detector, processing information associated with the detected illumination flux, and generating a first image based on at least information associated with the detected illumination flux. The first image includes a first image part for the pattern and a second image part for the specimen. Moreover, the method includes adjusting the lens to a state in order to achieve a first predetermined quality for the first image part, and moving the specimen to a first position.

6 Claims, 9 Drawing Sheets

The operation mechanism of a height sensor system.

Figure 1. An on-axis height sensor unit coupled with e-beam inspection system.

Figure 2. The operation mechanism of a height sensor system.

Figure 3. A flow chart illustrating a method for determining the height of a specimen.

Figure 4 the under-focus zone (x1~x2), just focus-zone (x2~x3) and over-focus zone (x3~x4) when wafer tilts.

Where:
a1 b1 is the image of line grating on wafer surface
$\theta$ is the target angle between optical axial and wafer; $\alpha$ is the wafer tilt; a3b3 is the mirror image after tilt; Oa1=L is the half grating length Tilt compensation
a1($L*\cos(\theta)$, $L*\sin(\theta)$)
a2($L*\cos(\theta)$,-$L*\sin(\theta)$)
a3($L*\cos(\theta +2\alpha)$,-$L*\sin(\theta +2\alpha)$)
the projection of a2a3 on a2b2 is: $L*(\cos(2\alpha)-1)=2L*\alpha^2$ Figure 5 Further illustrates the position variation error due to wafer tilt.

Figure 6 Symmetry distortion of grating image causes by tilt.

(a) Distortion compensation

Figure 7 Optical system distortions

Figure 8 symmetry distortions makes compensation

Figure 9 Symmetry distortions on opposite direction caused by optical lens aberration Figure 10 the convolution diagram of the grating image Figure 11 a typical predetermined grating pattern.

OPTICAL AUTO FOCUSING SYSTEM AND METHOD FOR ELECTRON BEAM INSPECTION TOOL

BACKGROUND OF THE INVENTION

The present invention generally relates to optical focusing. More particularly, the invention provides an apparatus and method for adjusting an objective lens and/or a sample stage. Merely by way of example, the invention has been applied to a scanning electron microscopy system. But it would be recognized that the invention has a much broader range of applicability.

Controlling critical process parameters may typically include assessing the performance characteristics of semiconductor fabrication processes such as resolution capability, across chip linewidth variations, and across wafer linewidth variations. As the dimensions of semiconductor devices continue to shrink with advances in semiconductor materials and processes, however, the ability to examine microscopic features and detect microscopic defects in semiconductor devices has become increasingly difficult.

During each semiconductor device fabrication process, defects such as particulate contamination and pattern defects may be introduced into the semiconductor devices. Such defects may be isolated to a single semiconductor device on a semiconductor wafer containing several hundreds semiconductor devices. Alternatively, the defects may be repeated in each semiconductor device formed across an entire semiconductor wafer. Isolated defects may be caused by random events such as an unexpected increase in particulate contamination in a manufacturing environment or an unexpected increase in contamination in process chemicals used in fabrication of the semiconductor devices. Repeated defects may be systematically caused by contamination or defects on a reticle.

Defects on semiconductor wafers may typically be monitored manually by visual inspection. Defects that may be visible to the human eye are limited by a lateral dimension 100 µm.

Automated inspection systems were developed to decrease the time required to inspect a wafer surface. Such inspection systems may typically include two major components such as an illumination system and a detection system. An illumination system may include a light source such as laser that may produce a beam of light and an apparatus for focusing and scanning the beam of light. Defects present on the surface may scatter the incident light. A detection system may detect the scattered light and may convert the detected light into electrical signals that may be measured, counted, and displayed on an oscilloscope or other monitor.

Systems used to manufacture semiconductor devices such as processing tools, metrology tools, and inspection tools may include a height sensor. A height sensor may be used to position a wafer within a system prior to the processing of the wafer. Height sensors may also be used in different configurations for different applications. Several height sensors that may be used as focusing sub-systems for processing, metrology, and inspection systems are currently available. But these height sensors often do not have sufficient effectiveness for automatic focusing in certain scanning electron microscopy systems.

Hence it is highly desirable to improve techniques for automatic focusing.

BRIEF SUMMARY OF THE INVENTION

The present invention generally relates to optical focusing. More particularly, the invention provides an apparatus and method for adjusting an objective lens and/or a sample stage. Merely by way of example, the invention has been applied to a scanning electron microscopy system. But it would be recognized that the invention has a much broader range of applicability.

According to an embodiment of the present invention, a method for inspecting a specimen includes providing an illumination flux through a pattern plate and a lens to a surface of a specimen to project a pattern onto the surface of the specimen. The pattern is associated with the pattern plate. Additionally, the method includes detecting the illumination flux reflected from the surface of the specimen with a detector, processing information associated with the detected illumination flux, and generating a first image based on at least information associated with the detected illumination flux. The first image includes a first image part for the pattern and a second image part for the specimen. Moreover, the method includes adjusting the lens to a state in order to achieve a first predetermined quality for the first image part, and moving the specimen to a first position in order to achieve a second predetermined quality for the second image part. The first image with the lens at the state and the specimen at the first position is a reference image. Also, the method includes moving the specimen in one or more of a first dimension and a second dimension to a second position. The first dimension and the second dimension form a plane. Additionally, the method includes generating a second image based on at least information associated with the detected illumination flux. The second image includes a third image part for the pattern and a fourth image part for the specimen. Moreover, the method includes processing information associated with the first image part of the reference image and the third image part of the second image, generating a signal based on at least information associated with the third image part of the second image and the first image part of the reference image, and adjusting the specimen in a third dimension to a third position in response to the signal. The third dimension is perpendicular to the plane. Also, the method includes performing a first inspection for the specimen at the third location.

According to another embodiment of the present invention, a system for inspecting a specimen includes an illumination system including an illumination source for providing an illumination flux, a light pattern plate associated with a pattern, and an optical system for guiding the illumination flux and projecting the pattern onto a surface of a specimen. Additionally, the system includes a detection system for detecting the illumination flux reflected from the surface of the specimen, and a stage system for receiving a first control signal and in response to at least the first control signal moving the specimen in one or more of a first dimension, a second dimension, and a third dimension. The first dimension and the second dimension form a plane, and the third dimension is perpendicular to the plane. Moreover, the system includes an image processing system for generating one or more images based on at least information associated with the detected illumination flux. Each of the one or more images includes a first image part for the pattern and a second image part for the specimen. Also, the system includes a focus processing system for receiving information associated with the one or more images from the image processing system, sending at least the first control signal to the stage system, and generating at least a second control signal. Additionally, the system includes an electron-beam inspection system for receiving at least the second control signal and in response to at least the second control signal performing one or more inspections for the specimen at one or more locations.

According to yet another embodiment of the present invention, a system for inspecting a specimen includes one or more components. The one or more components are configured to provide an illumination flux through a pattern plate and a lens to a surface of a specimen to project a pattern onto the surface of the specimen. The pattern is associated with the pattern plate. Additionally, the one or more components are configured to detect the illumination flux reflected from the surface of the specimen with a detector, process information associated with the detected illumination flux, and generate a first image based on at least information associated with the detected illumination flux. The first image includes a first image part for the pattern and a second image part for the specimen. Moreover, the one or more components are configured to adjust the lens to a state in order to achieve a first predetermined quality for the first image part, and move the specimen to a first position in order to achieve a second predetermined quality for the second image part. The first image with the lens at the state and the specimen at the first position is a reference image. Also, the one or more components are configured to move the specimen in one or more of a first dimension and a second dimension to a second position. The first dimension and the second dimension form a plane. Additionally, the one or more components are configured to generate a second image based on at least information associated with the detected illumination flux. The second image includes a third image part for the pattern and a fourth image part for the specimen. Moreover, the one or more components are configured to process information associated with the first image part of the reference image and the third image part of the second image, generate a signal based on at least information associated with the third image part of the second image and the first image part of the reference image, and adjust the specimen in a third dimension to a third position in response to the signal. The third dimension is perpendicular to the plane. Also, the one or more components are configured to perform a first inspection for the specimen at the third location.

According to yet another embodiment, patterns on a specimen such as topographical features, which may be formed upon or within a specimen such as a wafer, diffraction effects, and/or thin film interference effects may affect a height sensitive image such as spot projected onto a detector. Such a detector may include a position sensitive detector or device. A location of a centroid on a position sensitive detector may be used to determine the height of the specimen. Patterns of the specimen may reduce an intensity of the image on the position sensitive detector by up to about 90%. If the patterns also cause intensity variations across the image on the position sensitive detector, an apparent location of the centroid may be shifted. Such a shift in the apparent location of the centroid may introduce error into height determinations of the specimen.

According to yet another embodiment, the techniques to reduce pattern-induced errors in height sensor sub-system may include using white light to reduce thin film interference produced by the specimen. In addition, a charge-coupled device (CCD) camera and image processing may be used to increase the accuracy of identifying an actual center of the image spot. For height sensor sub-systems, in which light may be directed through an aperture opening to a specimen surface and then to a detector such as CCD, broadband light source may be used. For example, such light sources may exhibit many substantially incoherent wavelengths of light and may not produce a speckle effect on the detector as may be seen with laser sources. One embodiment adopts light emitted diode (LED) as light source. A white light LED may produce a wide spectrum of wavelengths of light; in addition, a white light LED may be modulated or demodulated to achieve reasonable noise rations.

Further, according to the yet another embodiment of the present invention, there is provided an algorithm for precise surface height determination that may limit the pattern-induced error. All of the previous arts are based on exact focus on the substrate surface to generate algorithm. However, in present invention the projection image of the line grating on the specimen surface and the reflection image on the CCD are processed through control unit to reveal three different focusing zones, under-focus zone, just-focus zone and over-focus zone. One embodiment provides a method to setup a window to locate the centroid position shift and eliminate the image distortion induced by wafer surface topography. The configuration and algorithm in the present invention provides position height of a specimen with relatively high precision within $3\sigma$.

Various additional objects, features and advantages of the present invention can be more fully appreciated with reference to the detailed description and the accompanying drawings that follow.

BRIEF DESCRIPTION OF THE DRAWINGS

The present investigation will be readily understood by the following detailed description in conjunction with the accompanying drawings, wherein like reference numerals designate like structural elements, and in which.

DETAILED DESCRIPTION OF THE INVENTION

The present invention generally relates to optical focusing. More particularly, the invention provides an apparatus and method for adjusting an objective lens and/or a sample stage. Merely by way of example, the invention has been applied to a scanning electron microscopy system. But it would be recognized that the invention has a much broader range of applicability.

Tuning to the drawings, FIGS. 1-11 are simplified diagrams according to one or more embodiments of the present invention. These diagrams are merely examples, which should not unduly limit the scope of the claims. One of ordinary skill in the art would recognize many variations, alternatives, and modifications.

Figure 1:
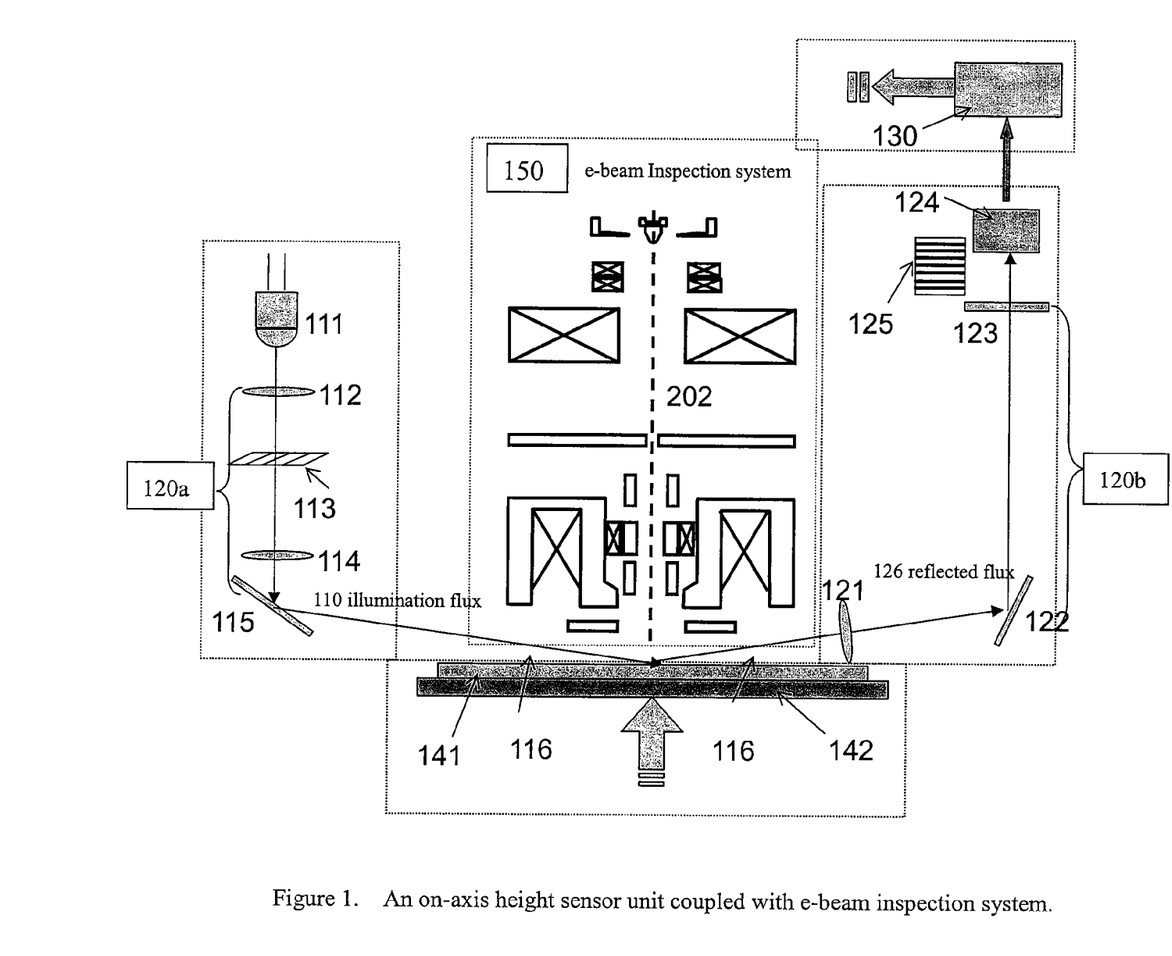
FIG. 1 is a diagrammatic representation of schematic drawing of an on-axis height sensor system, according to an embodiment of the present invention.

FIG. 1 illustrates an embodiment of an on-axis height sensor system. According to an embodiment, the term "on-axis height sensor system" refers to a system in which the height measurement location is substantially the same as a sample location of a lithographic or metrology system, not shown but located along axis 202. For example, as shown in FIG. 1, the on-axis height sensor system, such as on a processing, metrology, or inspection system, may direct illumination flux 110 at oblique angle 116 to a surface of specimen 141.

The system may be configured to determine a height of specimen 141. Specimen 141 may include, but may not be limited to, a wafer such as a substrate used for fabricating semiconductor devices. The system may include an illumination system. The illumination system may be configured to direct a beam of light to a surface of specimen 141. The illumination system may include a light source coupled to optical components. For example, the system may include light source 111. Light source may be configured to generate illumination flux 110. An appropriate light source may include, but may not be limited to, a metal halide lamp, a xenon arc lamp, a light emitting diode (LED), a fiber optic light source, a helium neon laser, a solid state laser diode, or any other light source known in the art. As much, illumination flux 110 may include monochromatic light or broadband light.

Illumination flux 110 may be direct to the surface of specimen 141 by lens 120a. Lens 120a may be configured as a condenser lens 112, a line grating with a period of 6 µm 113, a projection lens 114, a reflection mirror 115, or another lens known in the art. The illumination flux 110 may be directed through the grating 113 and project the grating image onto a surface of specimen 141 at angle of incidence 116, as measured with respect to the surface of specimen 141. Angle of incidence 116 may be an oblique angle, as shown in FIG. 1. For example, angle of incidence 116 may include an angle from about 4° to 7°, as measured with respect to the surface of specimen 141. The illumination system may also include addition optical components such as folding mirrors and spectral or polarizing filters.

At least a portion of illumination flux 110 may be specularly reflected from the surface of specimen 141. The system may include a collection system that may be configured to collect the specularly reflected flux 126. For example, the collection system may include lens 120b. Specularly reflected flux 126 may be directed through lens 120b. Lens 120b may be configured to focus reflected flux 126 onto image detector 124. Lens 120b may include imaging lens group 121, reflecting mirror 122, or other imaging lens known in the art. The collection system may also include a number of other optical components such as partially transmissive mirrors and spatial filters.

Reflected flux 126 striking a surface of image detector 124 may form dark and white grating pattern 125 on the surface of detector 124. Detector 124 may include a position sensitive detector (PSD). A PSD may be an optoelectronic device that may convert an incident light spot into position information. For example, an incident light spot may generate a photoelectric current in a PSD. The generated photoelectric current may flow through the device, and a mathematical relationship between the input and output currents of the device may be used to determine a position of the incident light spot. Detector 124 may include any 1- or 2-dimensional arrays of detectors known in the art, such as a bicell detector, a time delay integration (TDI) camera, or a charge-coupled device (CCD) type image array as the current investigation adopted.

Figure 2:
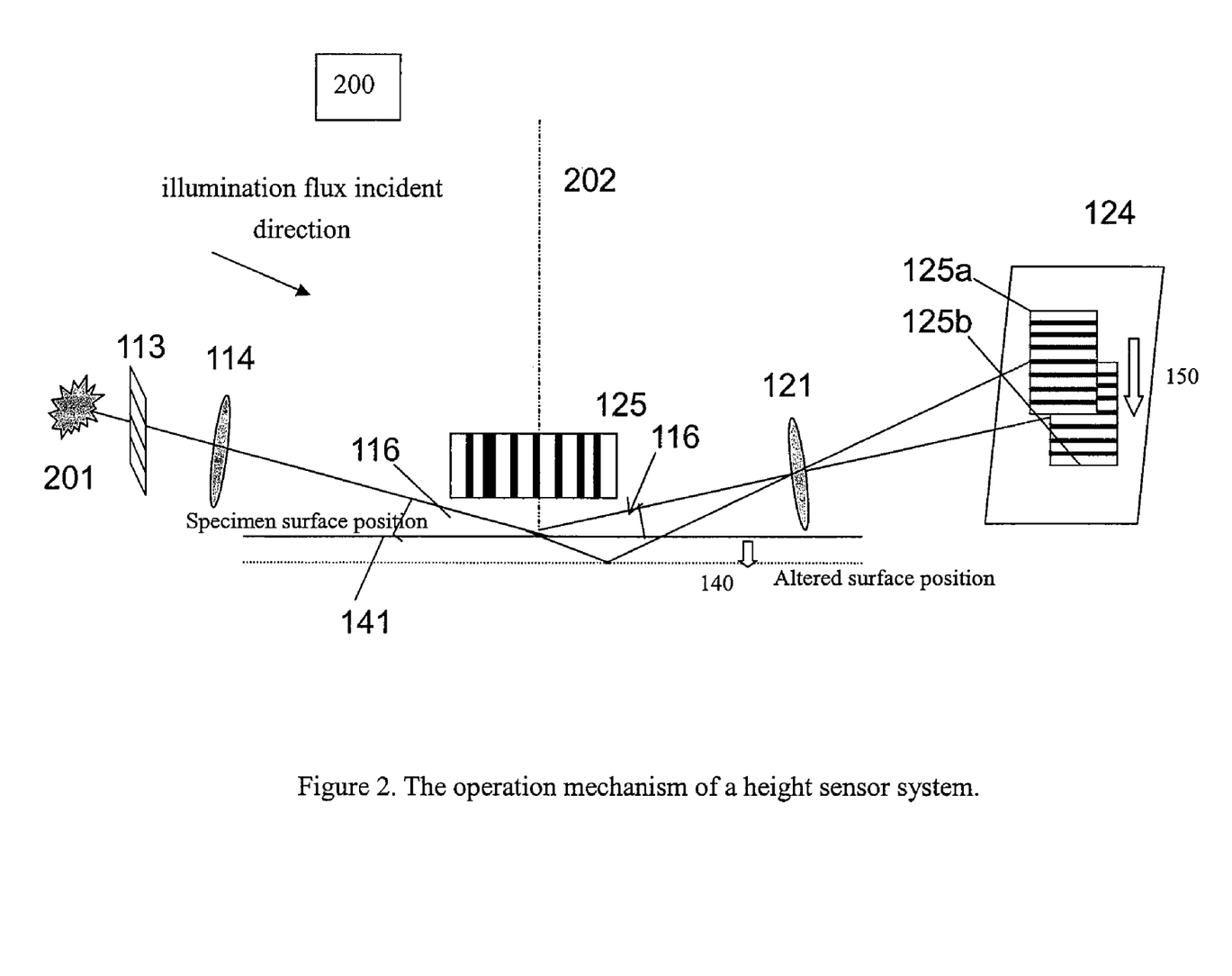
FIG. 2 is a diagrammatic representation of the operation mechanism of a height sensor system, according to an embodiment of the present invention.
Figure 3:
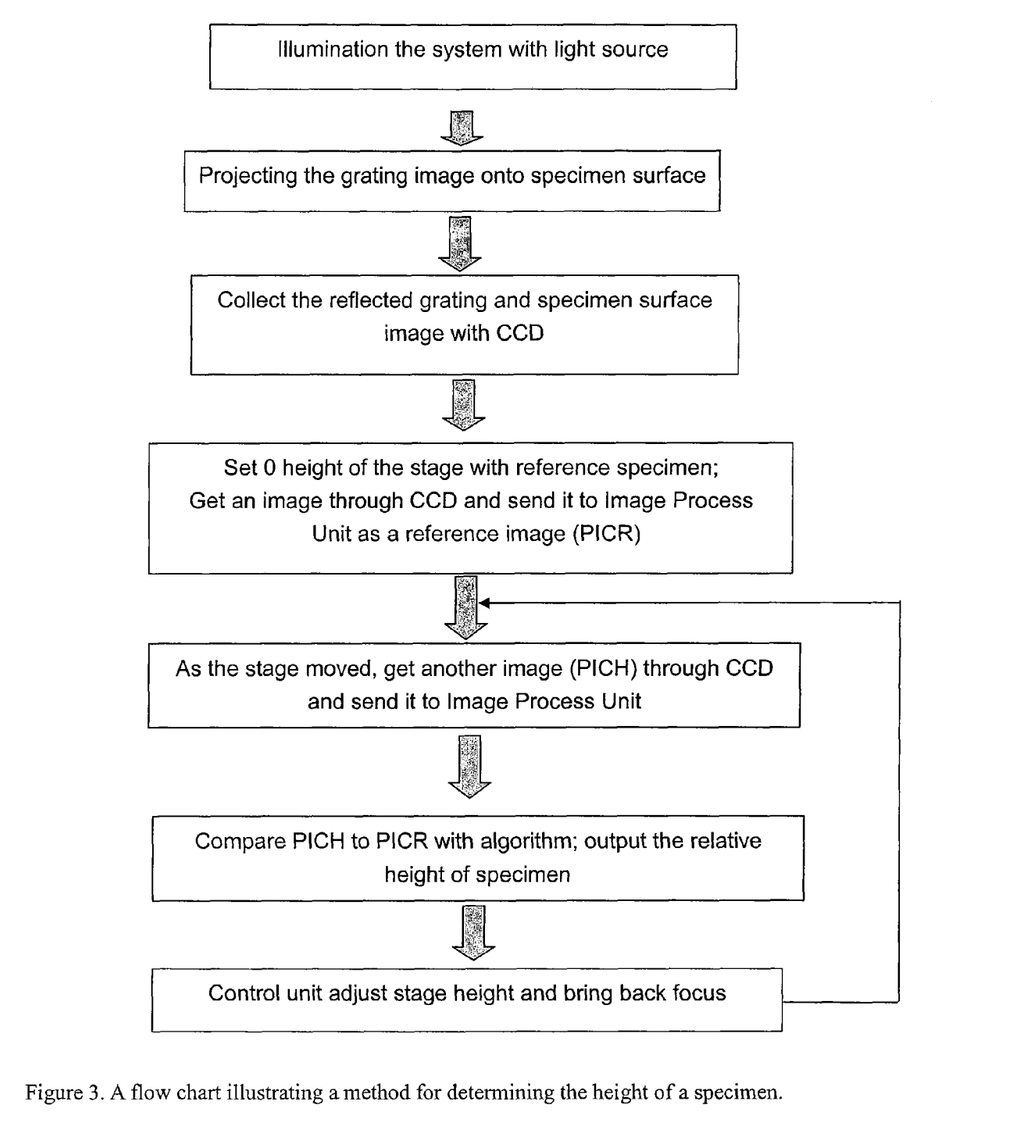
FIG. 3 is a flow chart illustrating a method for determining the height of a specimen, according to an embodiment of the present invention.

A position of projection grating image 125 on image detector 124 may very depending on, for example, a vertical position, or height of specimen 141. For example, as shown in FIG. 2, as specimen 141 move along a direction indicated by vector 140, reflected flux 126 collected by lens 120b may be propagating along a path at a larger angle of incidence with respect to a surface of the specimen than an angle of incident reflected flux 126. In this manner, a position of projection grating image 125 on detector 124 may be altered. For example as shown in FIG. 2, projection grating image 125 may move along a length of detector 124 as indicated by vector 150 as specimen 141 moves along a direction indicated by vector 150. In this manner, a signal generated by detector 124 may indicate a location of projection grating image 125. Therefore, a signal generated by detector 124 may also indicate a height of specimen 141.

The height assessment of the specimen may be used to alter a focus of the specimen to bring the specimen 141 into focus for subsequent processing. Therefore, during subsequent processing, the specimen may be substantially inaccurately positioned, or out of focus, due to the inaccurate assessment of the height of the specimen as described above. The image process and stage control unit 130 may generate a correction signal corresponding to the specimen height information to stage control unit (not shown on drawing) to bring the specimen 141 into focus.

Figure 4:
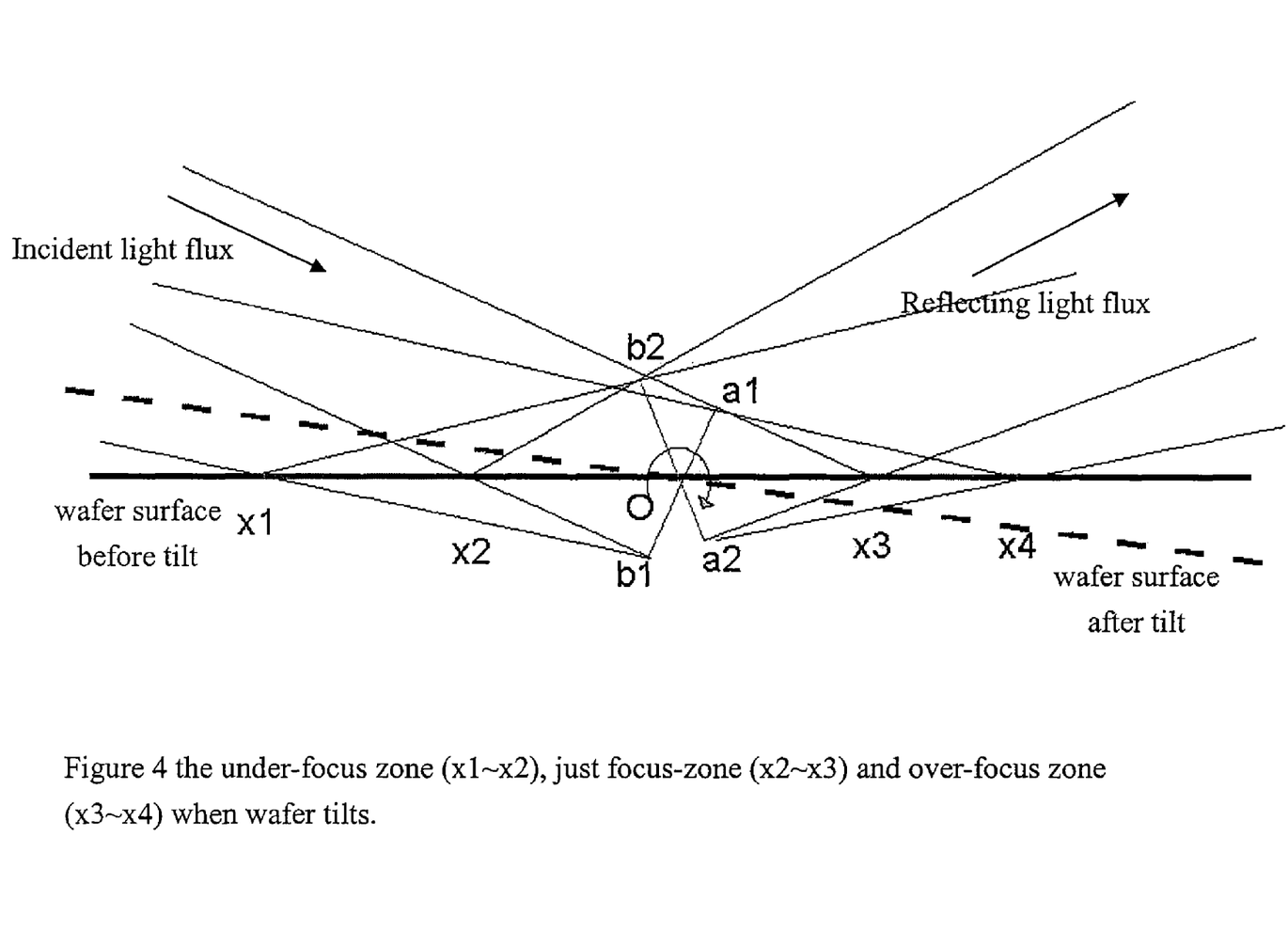
FIG. 4 illustrates the formation of under-focus zone, just focus-zone and over-focus zone on wafer surface as wafer tilts, according to an embodiment of the present invention.
Figure 5:
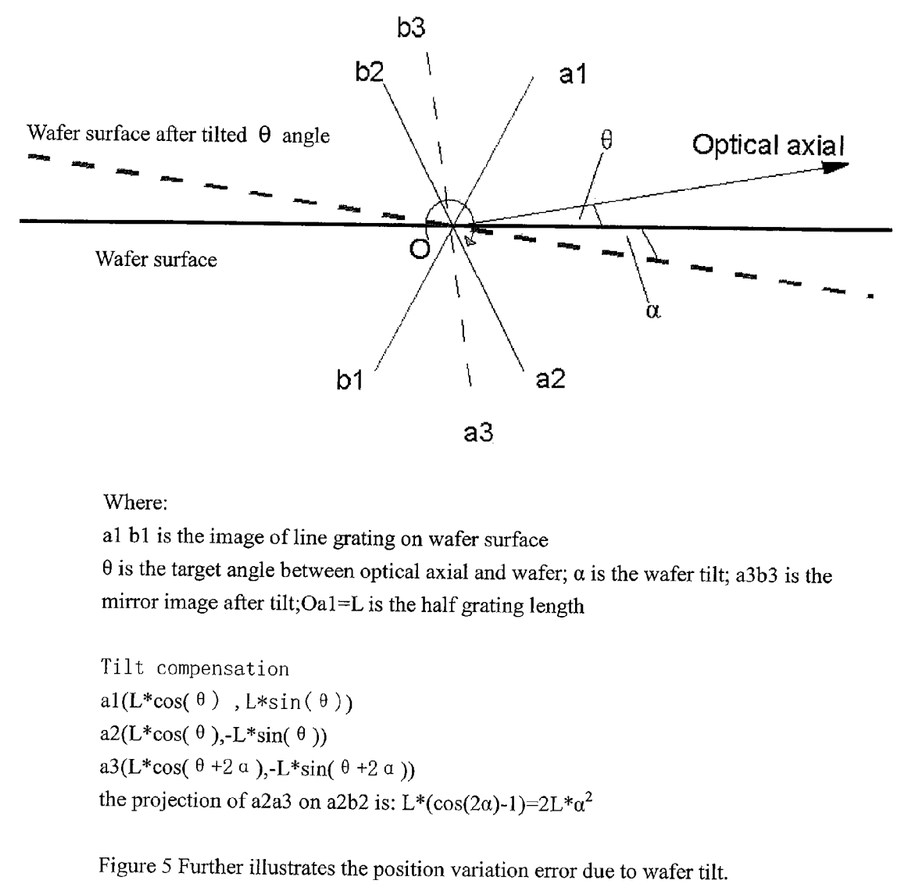
FIG. 5 further illustrates the position variation error due to wafer tilt, according to an embodiment of the present invention.
Figure 6:
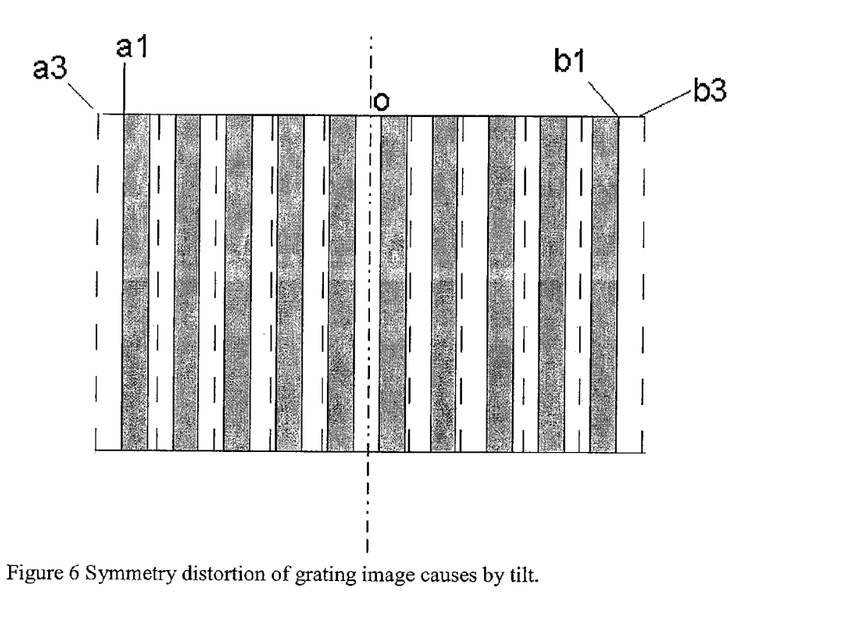
FIG. 6 illustrates the symmetry distortion of grating image causes by tilt, according to another embodiment of the present invention.
Figure 7:
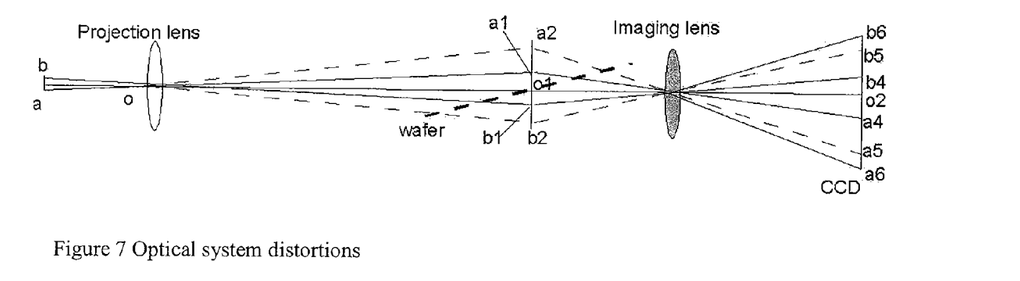
FIG. 7 illustrates the optical system distortions, according to an embodiment of the present invention.
Figure 8:
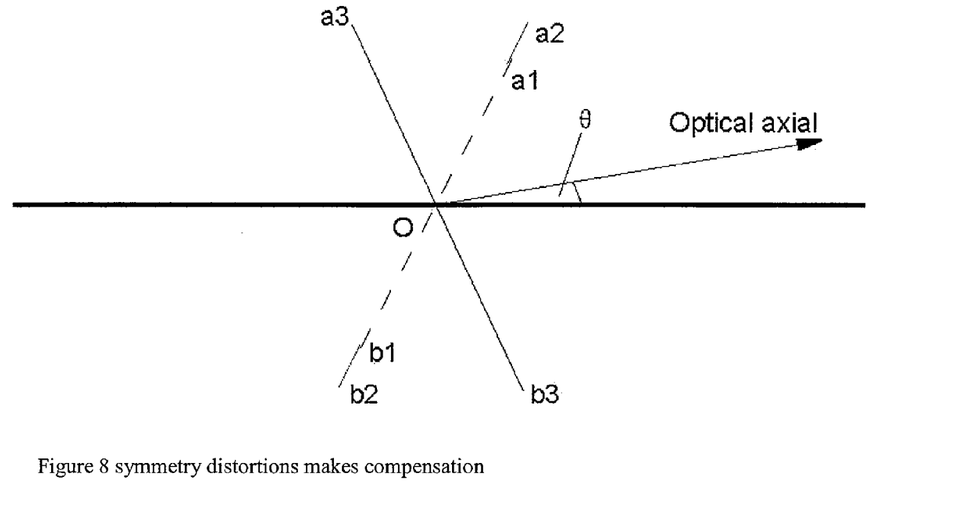
FIG. 8 illustrates the symmetry distortion compensation, according to another embodiment of the present invention.
Figure 9:
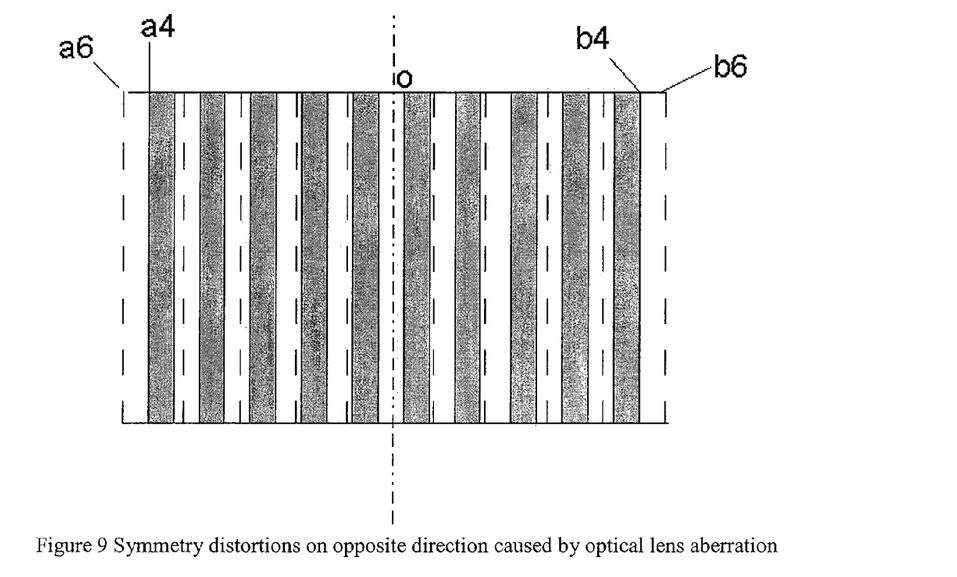
FIG. 9 illustrates the amount of grating image variation due to optical lenses aberration, according to an embodiment of the present invention.
Figure 10:
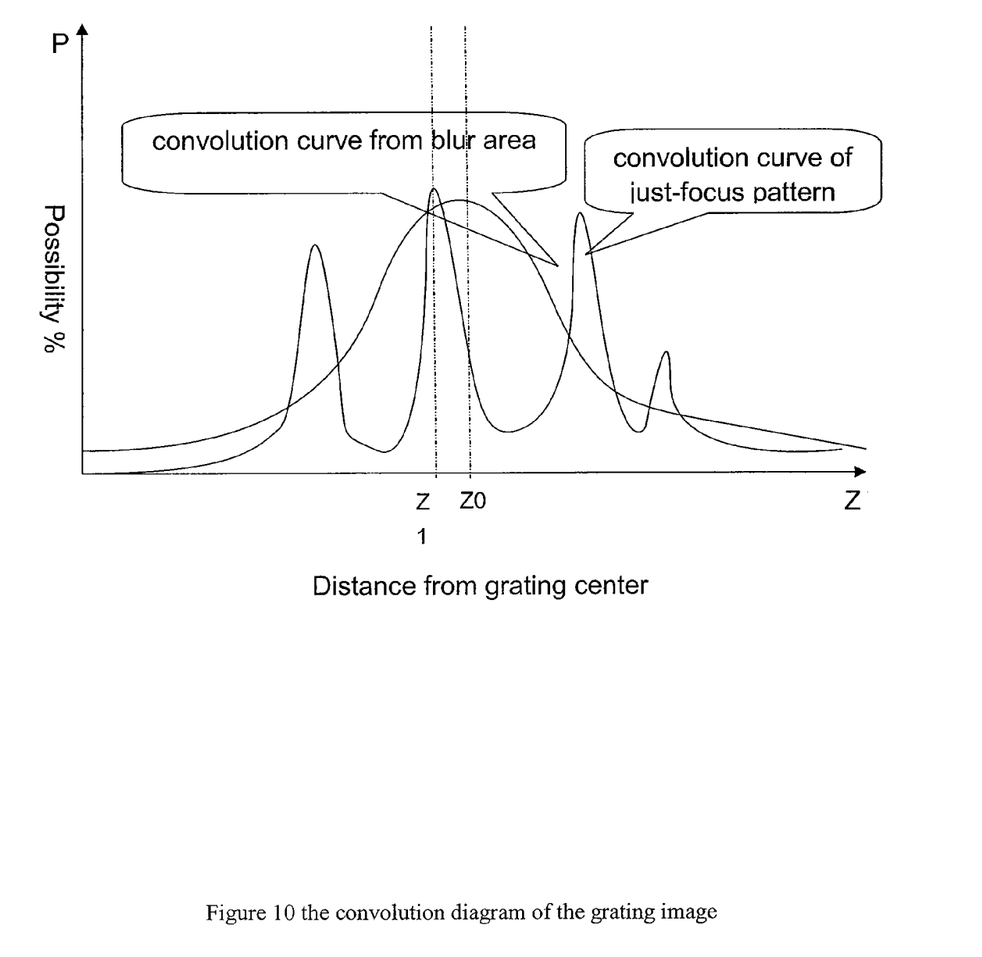
FIG. 10 illustrates the convolution diagram of the grating image, according to another embodiment of the present invention.

The projection of the grating image on the specimen surface was intended to make in 3 zones, under-focus zone, just-focus zone and over-focus zone as the FIG. 4 illustrated. Pattern and or surface topographical features of a semiconductor wafer will influence the reflected grating image out of the just-focus zone. The image distortion may sift the grating image increase the difficulty of position identification. If the wafer is tilted with an angle α, as FIG. 5 illustrated, the grating image variation on the wafer surface will be $2L\alpha^2$. Where L is the width of the line grating space. The variation amount of reflected image on the CCD will be which times magnification coefficient M. FIG. 6 illustrates the grating image distortion due to wafer tilt. Where the dash line represent the position of grating image on CCD. FIG. 7 illustrates the schematic of image distortion due to optical lenses (projection lens 114 and imaging lens 121). FIG. 9 illustrates the grating image variation amount due to optical lenses aberration. A similar stretch outward effect as FIG. 6 is presented. The variation amount of the grating image contributed by optical lenses is proportional to the distortion coefficient of optical lenses. The image of wafer on CCD can be classified into under-focus, just-focus, and over-focus zones overlapping with the grating image. To determine the height of the wafer surface, the centroid of the diagram must be located in the just-focus zone. The convolution diagram of the line grating within the just-focus zone is illustrated in FIG. 10. One may find that there are several possibilities for the centroid.

Figure 11:
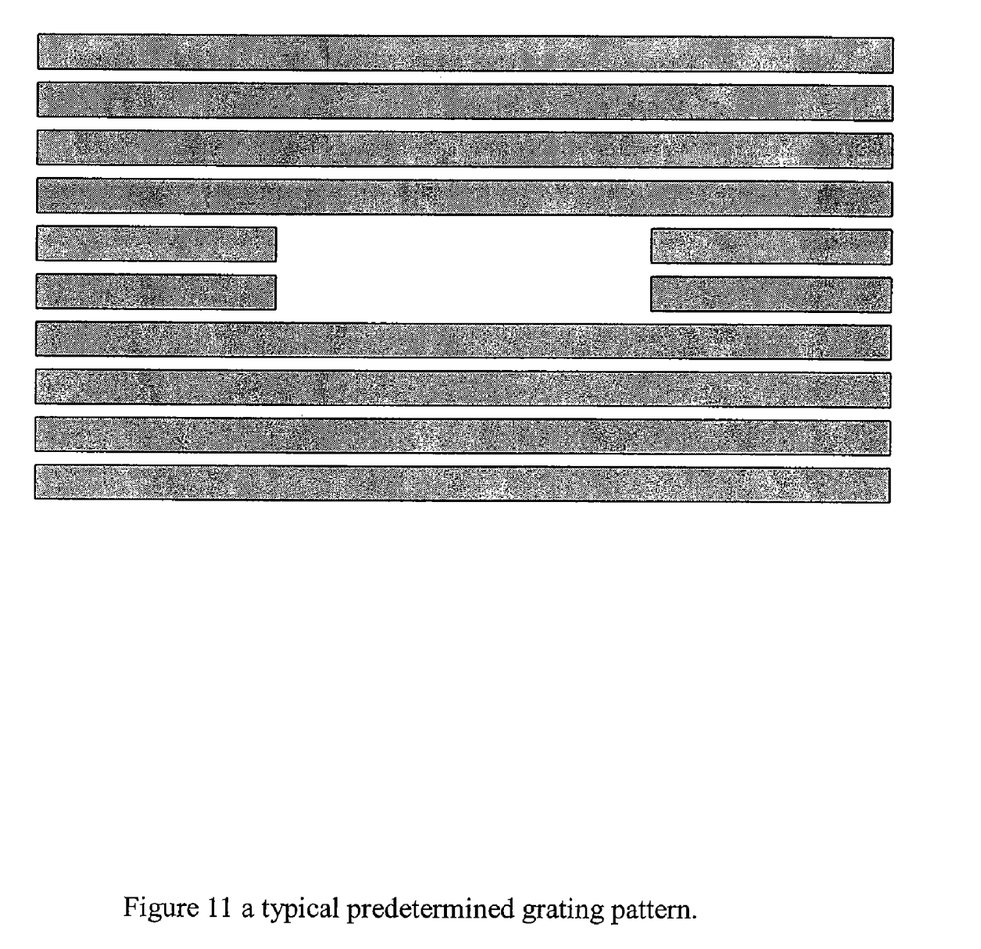
FIG. 11 illustrates a typical predetermined grating pattern, according to an embodiment of the present invention.

However, with the help of the convolution diagram from under-focus zone or over-focus zone, the influence of wafer surface pattern and surface topography may be eliminated. The centroid of the grating image could be identified through algorithm. Compare the original grating dimension and the image of grating on CCD; algorithms for calculate compensation of wafer surface height without distortion can be generated. The algorithm may eliminates influence from wafer tilt, rotation and surface topography induced error and provides the surface height determination within 3σ. A typical predetermined spacing line grating pattern is illustrated in FIG. 11. The uneven length in the center potion will enhance the pattern convolution ability thus shorten the image processing time.

According to an embodiment of the present invention, a method for inspecting a specimen includes providing an illumination flux 110 through a pattern plate 113 and a lens 120a to a surface of a specimen 141 to project an image pattern 125 onto the surface of the specimen. The image pattern is associated with the pattern plate. Additionally, the method includes detecting the illumination flux reflected 126 from the surface of the specimen with a detector 124, processing information associated with the detected illumination flux, and generating a first image 125a based on at least information associated with the detected illumination flux. The first image includes a first image part for the pattern and a second image part for the specimen. Moreover, the method includes adjusting the lens 120a and 120b to a state in order to achieve a first predetermined quality for the first image part, and moving the specimen to a first position in order to achieve a second predetermined quality for the second image part. The first image with the lens at the state and the specimen at the first position is a reference image. Also, the method includes moving the specimen in one or more of a first dimension and a second dimension to a second position. The first dimension and the second dimension form a plane, for example X and Y directions perpendicular to the primary beam axis 202. Additionally, the method includes generating a second image based on at least information associated with the detected illumination flux 126. The second image 125b includes a third image part for the pattern and a fourth image part for the specimen. Moreover, the method includes processing information associated with the first image part of the reference image and the third image part of the second image, generating a signal based on at least information associated with the third image part of the second image and the first image part of the reference image, and adjusting the specimen in a third dimension to a third position in response to the signal. The third dimension is perpendicular to the plane. Also, the method includes performing a first inspection for the specimen at the third location. For example, the method is implemented according to some or all of FIGS. 1-1.

For example, the first image part and the second image part overlap at least partially, or do not overlap. In another example, the first predetermined quality includes a predetermined contrast level, and/or a predetermined clarity level. In yet another example, the method includes performing a second inspection for the specimen at the first location. In yet another example, the first dimension and the second dimension are perpendicular to each other. In yet another example, the third image part and the fourth image part overlap at least partially, or do not overlap. In yet another example, the second predetermined quality includes a predetermined contrast level, and/or a predetermined clarity level. In yet another example, the processing information associated with the first image part of the reference image and the third image part of the second image includes determining a difference between a first location for the first image part in the reference image and a second location for the third image part in the second image, and the adjusting the specimen in a third dimension to a third position includes adjusting the second location for the third image part in the second image so that the second location becomes the same as the first location. In yet another example, the first predetermined quality and the second predetermined quality are the same or different.

According to another embodiment of the present invention, a system for inspecting a specimen includes an illumination system including an illumination source for providing an illumination flux 110, a light pattern plate 113 associated with a pattern, and an optical system 120a for guiding the illumination flux and projecting the pattern onto a surface of a specimen 141. Additionally, the system includes a detection system 124 for detecting the illumination flux reflected 126 from the surface of the specimen, and a stage system 142 for receiving a first control signal and in response to at least the first control signal moving the specimen in one or more of a first dimension, a second dimension, and a third dimension. The first dimension and the second dimension form a plane, and the third dimension is perpendicular to the plane. Moreover, the system includes an image processing and stage control system 130 including an image processing component and a focus processing component. The image processing component is configured to generate one or more images based on at least information associated with the detected illumination flux. Each of the one or more images includes a first image part for the pattern and a second image part for the specimen. Also, the focus processing component is configured to receive information associated with the one or more images from the image processing component, send at least the first control signal to the stage system 142, and generate at least a second control signal. Additionally, the system includes an electron-beam inspection system 150 for receiving at least the second control signal and in response to at least the second control signal performing one or more inspections for the specimen at one or more locations. For example, the system is implemented according to some or all of FIGS. 1-11.

For example, the light pattern plate includes a grid. In another example, the pattern is associated with various lengths and various spacing areas. In yet another example, the detection system includes a CCD camera. In yet another example, the illumination flux is a broad-band light beam. In yet another example, the electron-beam inspection system includes an electron beam source for providing an electron beam and an electromagnetic system for affecting the electron beam.

According to yet another embodiment of the present invention, a system for inspecting a specimen includes one or more components. The one or more components are configured to provide an illumination flux 110 through a pattern plate 113 and a lens 120a to a surface of a specimen to project an image pattern 125 onto the surface of the specimen 141. The pattern is associated with the pattern plate. Additionally, the one or more components are configured to detect the illumination flux reflected 126 from the surface of the specimen with a detector 124, process information associated with the detected illumination flux, and generate a first image based 125a on at least information associated with the detected illumination flux. The first image includes a first image part for the pattern and a second image part for the specimen. Moreover, the one or more components are configured to adjust the lens 120a and 120b to a state in order to achieve a first predetermined quality for the first image part, and move the specimen to a first position in order to achieve a second predetermined quality for the second image part. The first image 125a with the lens at the state and the specimen at the first position is a reference image. Also, the one or more components are configured to move the specimen in one or more of a first dimension and a second dimension to a second position. The first dimension and the second dimension form a plane. Additionally, the one or more components are configured to generate a second image 125b based on at least information associated with the detected illumination flux. The second image 125b includes a third image part for the pattern and a fourth image part for the specimen. Moreover, the one or more components are configured to process information associated with the first image part of the reference image and the third image part of the second image, generate a signal based on at least information associated with the third image part of the second image and the first image part of the reference image, and adjust the specimen in a third dimension to a third position in response to the signal. The third dimension is perpendicular to the plane. Also, the one or more components are configured to perform a first inspection for the specimen at the third location. For example, the system is implemented according to some or all of FIGS. 1-11.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for inspecting a specimen, the system comprising:
   an illumination system including an illumination source for providing an illumination flux;
   a light pattern plate associated with a pattern;
   an optical system for guiding the illumination flux and projecting the pattern onto a surface of a specimen;
   a detection system for detecting the illumination flux reflected from the surface of the specimen;
   a stage system for receiving a first control signal and in response to at least the first control signal moving the specimen in one or more of a first dimension, a second dimension, and a third dimension, the first dimension and the second dimension forming a plane, the third dimension being perpendicular to the plane;
   an image processing system for generating one or more images based on at least information associated with the detected illumination flux, each of the one or more images including a first image part for the pattern and a second image part for the specimen;
   a focus processing system for receiving information associated with the one or more images from the image processing system, sending at least the first control signal to the stage system, and generating at least a second control signal; and
   an electron-beam inspection system for receiving at least the second control signal and in response to at least the second control signal performing one or more inspections for the specimen at one or more locations.

2. The system of claim 1 wherein the light pattern plate includes a grid.

3. The system of claim 1 wherein the pattern is associated with various lengths and various spacing areas.

4. The system of claim 1 wherein the detection system includes a CCD camera.

5. The system of claim 1 wherein the illumination flux is a broad-band light beam.

6. The system of claim 1 wherein the electron-beam inspection system includes an electron beam source for providing an electron beam and an electromagnetic system for affecting the electron beam.

* * * * *